United States Patent [19]

Olowolafe et al.

[11] Patent Number: 5,393,703
[45] Date of Patent: Feb. 28, 1995

[54] PROCESS FOR FORMING A CONDUCTIVE LAYER FOR SEMICONDUCTOR DEVICES

[75] Inventors: Johnson O. Olowolafe; Hisao Kawasaki; Chii-Chang Lee, all of Austin, Tex.

[73] Assignee: Motorola, Inc., Schaumburg, Ill.

[21] Appl. No.: 150,900

[22] Filed: Nov. 12, 1993

[51] Int. Cl.$^6$ .................................... H01L 21/283
[52] U.S. Cl. .................. 437/197; 437/190; 437/192; 437/194
[58] Field of Search ........... 437/197, 198, 199, 190, 437/192, 194; 257/771

[56] References Cited

U.S. PATENT DOCUMENTS

| | | |
|---|---|---|
| 4,561,009 | 12/1985 | Yonezawa et al. |
| 5,141,897 | 8/1992 | Manocha et al. ............... 437/228 |

FOREIGN PATENT DOCUMENTS

| | | | |
|---|---|---|---|
| 2253274 | 6/1975 | France | ................. 437/197 |
| 3414781 | 10/1984 | Germany | ................. 437/197 |
| 52-115175 | 9/1977 | Japan | . |
| 58-124235 | 7/1983 | Japan | ................. 437/197 |
| 62-85443 | 4/1987 | Japan | ................. 437/197 |
| 63-253644 | 10/1988 | Japan | ................. 437/198 |
| 4-44228 | 3/1992 | Japan | ................. 437/197 |
| 4-71231 | 3/1992 | Japan | ................. 437/197 |

OTHER PUBLICATIONS

Wolf, Silicon Processing, Lattice Press, 1990, vol. 2, pp. 110–111, 132–133.

Ogawa, et al.; "A Novel Al–Sc (Scandium) Alloy for Future LSI Interconnection;" IEDM; pp. 277–280 (1991).

Onuki, et al.; "High–Reliability Interconnections for ULSI Using Al–Si–Pd–Nb/Mo Layered Films;" IEEE Transactions on Electron Devices; vol. 39, No. 6; pp. 1322–1326 (Jun. 1992).

D'Heurle; "The Effect of Copper Additions on Electromigration in Aluminum Thin Films;" Metallurgical Transactions; vol. 2; pp. 683–689 (1971).

Gangulee, et al.; "Effect of Alloy Additions on Electromigration Failures in Thin Aluminum Films;" Applied Phys. Let.; vol. 19, No. 3; pp. 76–77 (1971).

Primary Examiner—T. N. Quach
Attorney, Agent, or Firm—George R. Meyer

[57] ABSTRACT

An aluminum-nickel-chromium (Al-Ni-Cr) layer used as an interconnect within a semiconductor device is disclosed. The Al-Ni-Cr layer has about 0.1–0.5 weight percent nickel and about 0.02–0.1 weight percent chromium. Usually, the nickel or chromium concentrations are no greater than 0.5 weight percent. The layer is resistant to electromigration and corrosion. The low nickel and chromium concentrations allow the layer to be deposited and patterned similar to most aluminum-based layers.

20 Claims, 3 Drawing Sheets

5,393,703

PROCESS FOR FORMING A CONDUCTIVE LAYER FOR SEMICONDUCTOR DEVICES

FIELD OF THE INVENTION

The present invention relates to the field of semiconductor devices, and in particular, to conductive layers for semiconductor devices.

BACKGROUND OF THE INVENTION

Aluminum is widely used for interconnects in semiconductor devices. However, aluminum has been found to be susceptible to a number of problems that may lead to device failure. Component densities (number of components per substrate area within an integrated circuit) typically are becoming higher as the size of components within a semiconductor device become smaller. The higher component density typically causes higher current densities in conductive layers when the device is operating. The higher current density generally results in an increase of device failure because of electromigration, which is a current-induced mass transport that is a function of current density and temperature of the device. Pure aluminum has problems with electromigration. In addition to electromigration, corrosion of the aluminum is a problem and is usually caused by chlorine exposure to the aluminum in an ambient including water, such as air exposure of an aluminum layer immediate following a dry etching step using chlorine-containing chemistry.

In an attempt to solve the problems discussed above, an element, such as silicon (Si), copper (Cu), nickel (Ni), or chromium (Cr) has been added to aluminum to form alloys. In reality, these alloys either do not solve all of the problems previously discussed or cause other problems. Electromigration is typically measured in terms of median-time-to-fail (MTTF) for a given current density and temperature. At a current density of about $4 \times 10^6$ amperes per square centimeter and a temperature of about 175 degrees Celsius, the MTTF for Al-Cr is reported to be about 830 hours and that of Al-Ni is reported to be only about 300 hours.

In addition, many aluminum alloys do not etch similar to aluminum and require aggressive processing conditions that may attack other portions of the semiconductor device, such as silicon dioxide. Therefore, new process steps may need to be developed. Also, when the concentrations of some of the elements in the aluminum alloy become too high, the resistance of the conductive layer may be too high.

SUMMARY OF THE INVENTION

The present invention includes a semiconductor device comprising a semiconductor substrate and a conductive layer overlying the substrate, wherein the conductive layer includes aluminum, nickel, and chromium. The present invention also includes processes for forming the device.

Other features and advantages of the present invention will be apparent from the accompanying drawings and from the detailed description that follows.

BRIEF DESCRIPTION OF THE DRAWINGS

The present invention is illustrated by way of example and not limitation in the figures of the accompanying drawings, in which like references indicate similar elements, and in which.

DETAILED DESCRIPTION OF EMBODIMENTS

An aluminum-nickel-copper (Al-Ni-Cr) alloy layer may be used as an interconnect or part of an interconnect. The Al-Ni-Cr alloy layer has a relatively low content of nickel and chromium. Therefore, the Al-Ni-Cr alloy layer may be deposited and etched similar to conventional aluminum-based layers that are also used for interconnects. The Al-Ni-Cr alloy layer has many benefits including resistance to electromigration and corrosion. The use and benefits of the Al-Ni-Cr alloy layer are better understood with the embodiments described below.

Device Including an Al-Ni-Cr Layer

Figure 1:
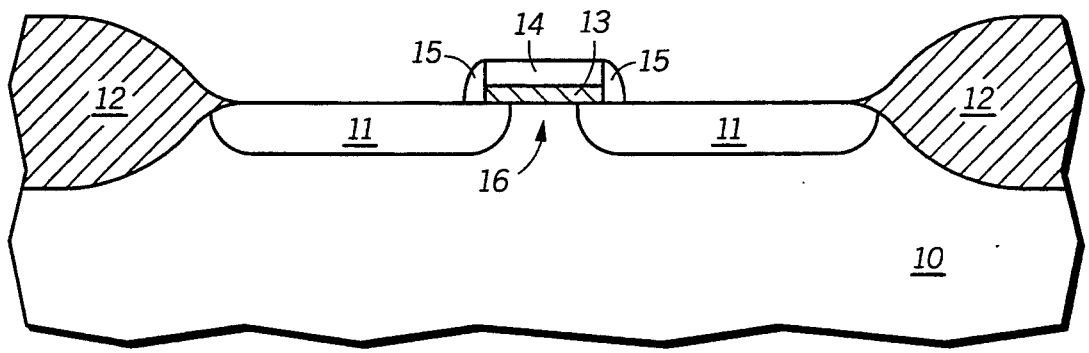
FIG. 1 includes a cross-sectional view of a portion of a semiconductor substrate including a transistor and field isolation regions.

FIG. 1 includes a cross-sectional view of a portion of a silicon substrate 10. Doped regions 11 act as source/drain regions and lie adjacent to the primary surface of the substrate 10. Adjacent to the doped regions 11 are field isolation regions 12. Between the doped regions is a channel region 16. A gate dielectric layer 13 overlies the channel region 16 and portions of the doped regions 11, and a gate electrode 14 overlies the gate dielectric layer 13. The gate electrode 14 typically includes a silicon containing material, such as amorphous silicon, polycrystalline silicon (polysilicon), and/or a refractory metal silicide. Spacers 15 overlie the doped regions 11 and lie adjacent to sides of the gate dielectric layer 13 and the gate electrode 14. Process steps used to form the device at this point in the process are conventional.

Figure 2:
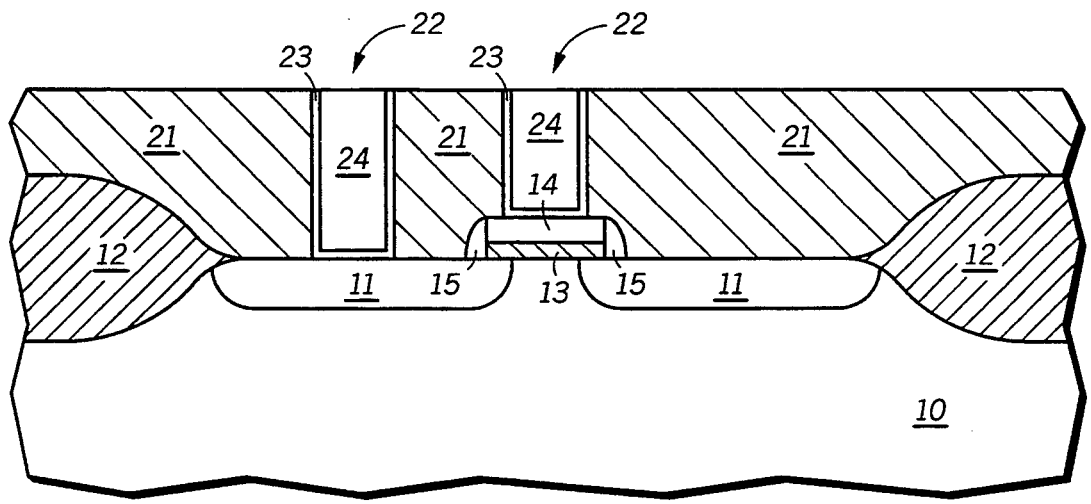
FIG. 2 includes a cross-sectional view of the substrate of FIG. 1 after forming a first insulating layer and contact plugs.

A first insulating layer 21 is formed over the substrate 10 as shown in FIG. 2. A first masking layer (not shown) is formed over the first insulating layer. The first insulating layer 21 is patterned to form contact openings to expose portions of one of the doped regions 11 and the gate electrode 14. The width of the openings are typically about 0.6 to 1.0 micron wide, although other widths may be used. Other contact openings (not shown) may be formed to other parts of the device. The first masking layer is removed after the contact openings are formed.

Contact plugs 22 are formed within the contact openings as shown in FIG. 2. A first barrier/glue layer 23 is deposited over the first insulating layer 21 and within the contact openings. The first barrier/glue layer 23 includes a titanium layer about 200 angstroms thick that acts as a glue layer and a titanium nitride (TIN) layer about 600 angstroms thick that acts as a barrier layer. A first tungsten layer 24 is blanket deposited to a thickness sufficient to fill the contact openings. Portions of the first barrier/glue and first tungsten layers 23 and 24 overlying the first insulating layer 21 are removed using a conventional etching step, thereby forming the contact plugs 22.

Figure 3:
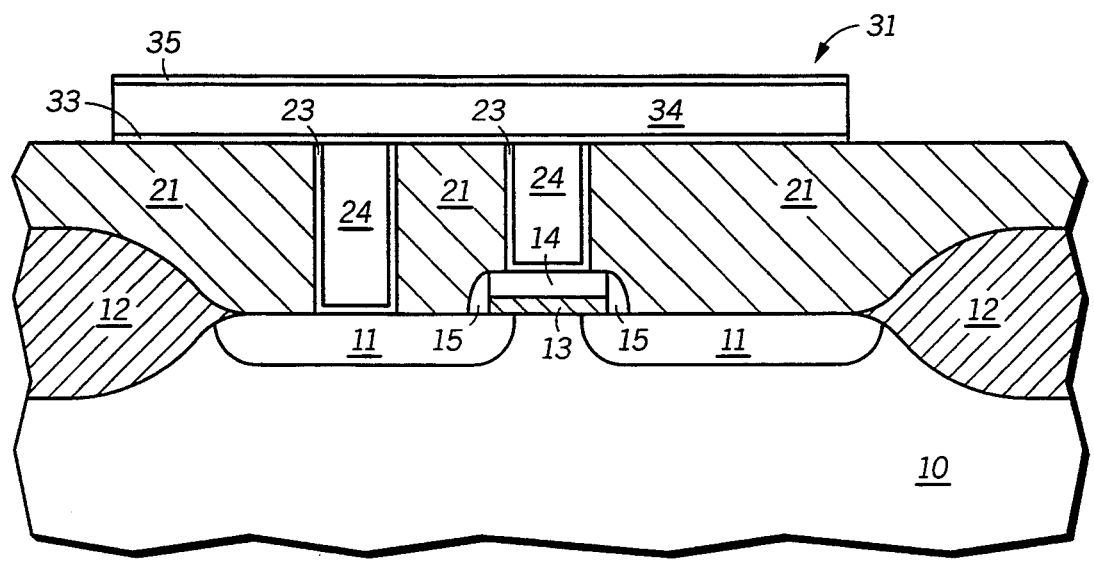
FIG. 3 includes a cross-sectional view of the substrate of FIG. 2 after forming a first interconnecting member.

A first interconnecting member 31 is formed over the first insulating layer 21 as shown in FIG. 3. The first interconnecting member 31 is formed by sequentially sputter depositing four conductive layers and patterning those layers to form the first interconnecting member 31. The first two layers form a second barrier/glue layer 33 and is similar to the first barrier/glue layer 23 except that the TiN layer is about 400 angstroms thick. The third conductive layer 34 includes an aluminum-nickel-chromium (Al-Ni-Cr) alloy typically having about 0.1–0.5 weight percent nickel, about 0.02–0.1 weight percent chromium, and the balance aluminum. The third conductive layer 34 is about 6000 angstroms thick. In other embodiments, the TiN layer of the second barrier/glue layer 33 has a thickness between about 400–800 angstroms, and the third conductive layer 34 has a thickness typically between 1000–15,000 angstroms thick. The fourth conductive layer is a first antireflective coating 35 that is a TiN layer about 250 angstroms thick.

A second masking layer (not shown) is formed over the first antireflective coating 35. The layers 33–35 are etched during a single etch step to form the first interconnecting member 31. Other first interconnecting members (not shown) are also formed. The etching step is performed using at least one chlorine-containing gas, such as molecular chlorine ($Cl_2$), boron trichloride ($BCl_3$), and the like. Diluting gases, such as nitrogen, helium, and the like, may also be used. The width of the first interconnecting members 31 may be about 0.9 micron wide. Typically, the width of the first interconnecting members 31 may be between about 0.5–1.5 micron wide. The length of the first interconnecting members 31 may be virtually any length, but is typically longer than the width. The second masking layer is then removed.

The first interconnecting member 31 is annealed at about 390 degrees Celsius for a time of about 30 minutes in an ambient including nitrogen and hydrogen. In other embodiments, the temperature may be between about 350 degrees–450 degrees Celsius, the time may be between 10–100 minutes, and the ambient may include only hydrogen, nitrogen, helium, or argon, or may include a combination those gases.

Figure 4:
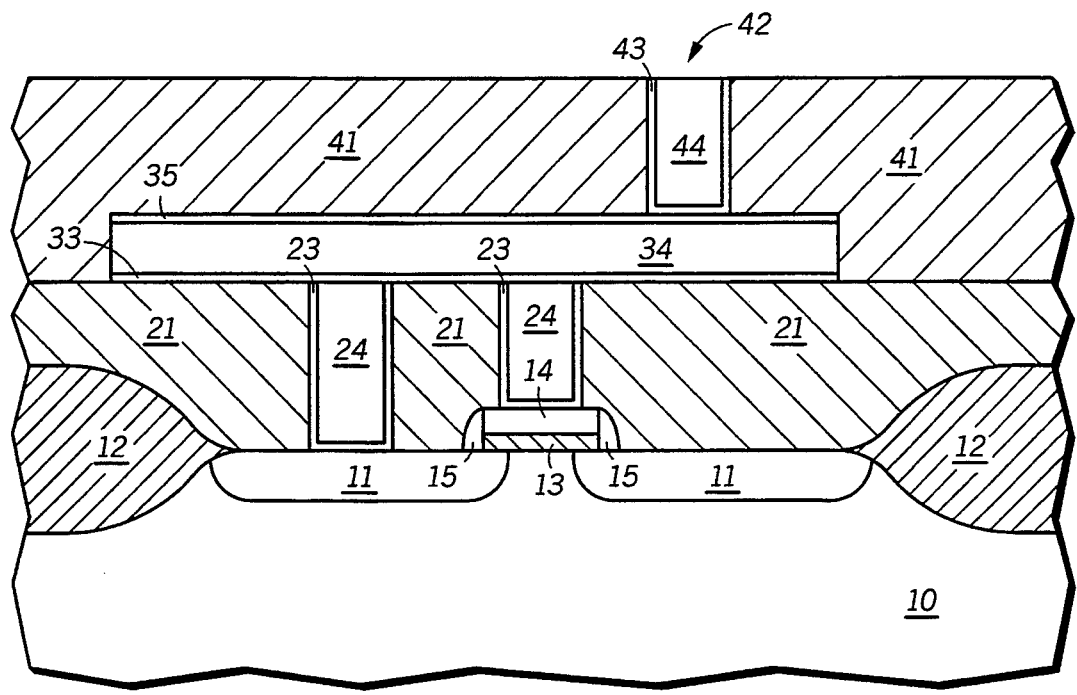
FIG. 4 includes a cross-sectional view of the substrate of FIG. 3 after forming a second insulating layer and via plugs.

A second insulating layer 41, a via opening, and a via plug 42 are formed over the first insulating layer 21 and the first interconnecting member 31 as shown in FIG. 4. The via opening and via plug 42 are formed similar to the contact openings and contact plugs 22, respectively. The via plug 42 includes a third barrier/glue layer 43 and a second tungsten layer 44 that are similar to the first barrier/glue layer 23 and the first tungsten layer 24, respectively. Other via openings (not shown) and via plugs 42 (not shown) are also formed.

Figure 5:
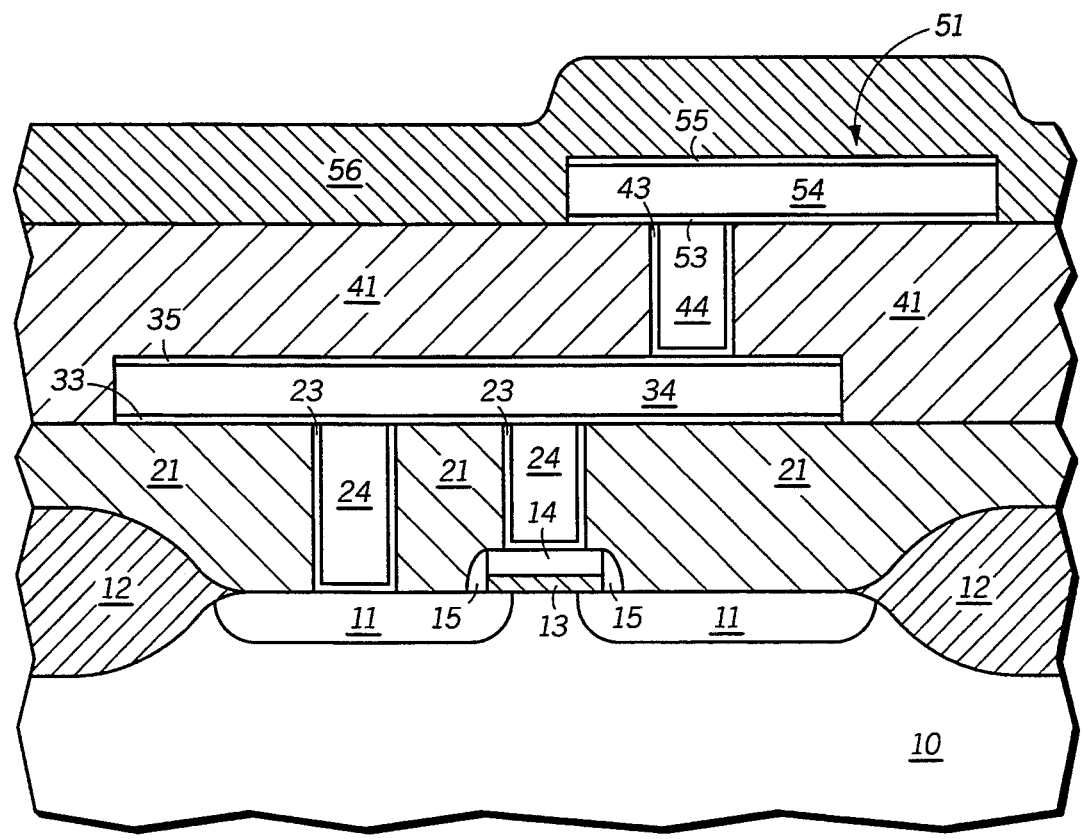
FIG. 5 includes a cross-sectional view of the substrate of FIG. 4 after forming a second interconnecting member.

A second interconnecting member 51 is formed over the second insulating layer 41 and via plugs as shown in FIG. 5. The second interconnecting member 51 is formed similar to the first interconnecting member 31. The second interconnecting member includes four conductive layers. A fourth barrier/glue layer 53 includes a titanium and TiN layer similar to the second barrier/glue layer 33. The second interconnecting member 51 also includes an intermediate layer 54 of Al-Ni-Cr similar to the third conductive layer 34 and a second antireflective coating 55 made of a TiN layer similar to the first antireflective coating 35. The four conductive layers are etched to form the second interconnecting member 51 similar to the first interconnecting member 31. Other second interconnecting members (not shown) are also formed. The second interconnecting member 51 is annealed similar to the first interconnecting member 31. A passivation layer 56 is formed over the second interconnecting member 51 as shown in FIG. 5 to form a substantially completed device. As used in this specification, the passivation layer is one or more layers formed over the uppermost interconnecting level. Therefore, no interconnecting layers are formed on the passivation layer.

In forming the semiconductor device, other electrical connections or additional layers may be required. One skilled in the art can determine whether other electrical connections or additional layers are needed.

Processing options are available in this embodiment. In one option, more than one etching step may be performed to form the first and second interconnecting members 31 and 51. In yet another option, the annealing step following the formation of the first interconnecting member 31 may be omitted if the annealing step following the formation of the second interconnecting member 51 is sufficient to anneal both the first and second interconnecting members 31 and 51. Also, the annealing step following the formation of the second interconnecting member 51 may be performed after the passivation layer 56 is formed rather that before the passivation layer 56 is formed. In another embodiment, the contact plugs 22 or the via plugs 42 do not have to be separately formed. For example, after forming the via openings, the four layers that form the second interconnecting member 51 are sputter deposited onto the second insulating layer 41 and within the via openings and etched to form the second interconnecting member 51. Therefore, the first and second interconnecting members 31 and 51 may contact each other.

Materials options also exist. Other semiconductor materials such as germanium and gallium arsenide may be used for the silicon substrate 10. Separate glue and barrier layers are not needed for the glue/barrier layers 23, 33, 43, and 53. A single layer may be used for one of the glue/barrier layers if the single layer adheres to insulating, silicon, and metal layers and helps to reduce adverse interactions between a metal-containing layer and a silicon-containing layer. Refractory metals, such as tantalum, tungsten, cobalt, molybdenum, and the like and their silicides may be used as glue and/or barrier layers. The selection of proper materials for glue/barrier layers may be performed by those skilled in the art. The antireflective coatings may include silicon nitride, tungsten nitride, or the like.

Benefits of the Embodiments

Aluminum-silicon-copper (Al-Si-Cu), aluminum-copper (Al-Cu) and Al-Ni-Cr layers were compared to determine their times to failure. The Al-Si-Cu layer included about one weight percent silicon and one weight percent copper, the Al-Cu layer included about one weight percent copper, and the Al-Ni-Cr layer included about 0.2 weight percent nickel and about 0.04 weight percent chromium. The layers were patterned to with the same masking layer and tested with a current density of about $4 \times 10^6$ amperes per square centimeter and an ambient temperature of about 200 degrees Celsius.

Figure 6:
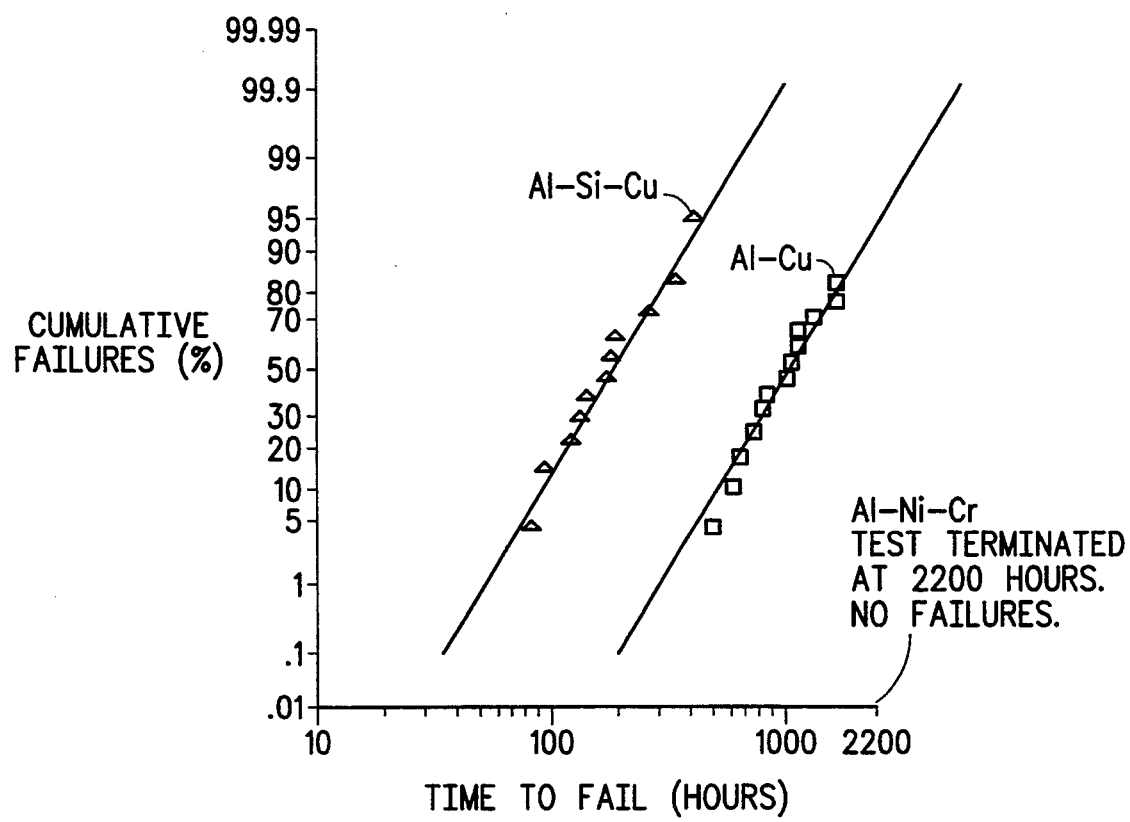
FIG. 6 includes a plot of cumulative failures versus time for aluminum-nickel-chromium, aluminum-silicon-copper, and aluminum-copper layers.

FIG. 6 includes a graph of the cumulative failures (%) versus time (hours) for the three layers. The MTTF for the Al-Si-Cu layer was about 295 hours, and the MTTF for the Al-Cu layer is about 990 hours. Unlike the Al-Si-Cu and Al-Cu layers, the Al-Ni-Cr layer did not have any failures even after 2200 hours. If the data obtained for Al-Ni-Cr layer is adjusted to 175 degrees Celsius, the MTTF would be no less than about 20,000 hours. Because no failures were seen with the Al-Ni-Cr layer after 2200 hours, the MTTF estimate of 20,000 hours may actually be low. In any event, the Al-Ni-Cr layer should have an MTTF of at least 2-20 times longer compared to the Al-Si-Cu, Al-Cu, Al-Ni, and Al-Cr layers. Although the MTTF measurement is pattern dependent, it is assumed that the pattern used for the Al-Ni and Al-Cr layers described in the background section have patterns similar to the Al-Ni-Cr layer.

The Al-Ni-Cr layer allows it to be used as an interconnect because of its resistivity is similar to other aluminum alloys. The Al-Ni-Cr layer resistivity of about 3.15 microohms.cm, the Al-Cu layer has a resistivity of about 3.1 microohms.cm, and the Al-Si-Cu layer has a resistivity of about 3.35 microohms.cm. If the nickel or chromium concentrations are greater than 0.5 weight percent, the resistivity of the Al-Ni-Cr layer with that nickel and chromium content may be too high. If resistivity is less of a concern, even higher concentrations of nickel and chromium may be used. If the concentration of the nickel and chromium are too high, such as about 3 weight percent each, then the Al-Ni-Cr layer may not etch similar to aluminum. Therefore, each of the nickel and chromium concentration should not be higher than about 0.5 weight percent.

Al-Cu and Al-Ni-Cr layers were etched using a chlorine-containing plasma. Corrosion was evident with the Al-Cu layer while no evidence of corrosion was found on the Al-Ni-Cr layer. The Al-Ni-Cr layer is expected to be more corrosion resistant compared to Al-Si-Cu, Al-Cu, and Al-Ni. Copper should not be included in the Al-Ni-Cr layer because copper may enhance its corrosion.

Another benefit is the simplicity in which Al-Ni-Cr may be incorporated into an existing process sequence. Depositing and etching the Al-Ni-Cr is expected to be similar to depositing and etching the Al-Si or Al-Si-Cu layers previously described. Other than possibly the parameters previously described above, virtually all other parameters for depositing and etching are expected to be virtually the same for Al-Ni-Cr, Al-Si, and Al-Si-Cu. The reason why the Al-Ni-Cr layer is expected to deposit and etch similar to Al-Si and Al-Si-Cu is because the nickel and chromium concentrations are low (no greater than about 0.5 and 0.1 weight percent, respectively).

In the foregoing specification, the invention has been described with reference to specific embodiments thereof. However, it will be evident that various modifications and changes can be made thereto without departing from the broader spirit or scope of the invention as set forth in the appended claims. Accordingly, the specification and drawings are to be regarded in an illustrative rather than a restrictive sense.

What is claimed is:

1. A process for forming a semiconductor device comprising the steps of:
   forming an interconnecting member over a semiconductor substrate, wherein the interconnecting member is formed by steps including:
      forming a conductive layer over the substrate, wherein: the conductive layer includes an alloy; and
      the alloy includes aluminum, nickel, and chromium, but no silicon; and
      etching the conductive layer, wherein the conductive layer extends along all of the interconnecting member; and
   forming a passivation layer over the interconnecting member.

2. The process of claim 1, further comprising steps of:
   forming a conductor, wherein the conductor is selected from a group consisting of a doped region lying within a semiconductor substrate, a gate electrode overlying the substrate, a silicon-containing electrode overlying the substrate, and a metal-containing member overlying the substrate; and
   forming an insulating layer over the conductor and including an opening, wherein at least a portion of the conductor is exposed within the opening,
   wherein the step of forming the conductive layer is performed such that at least a portion of the conductive layer is formed over the insulating layer, and wherein the conductive layer is electrically connected to the conductor.

3. The process of claim 1, further comprising a step of annealing the interconnecting member after the step of forming the passivation layer.

4. The process of claim 1, wherein the step of forming the conductive layer is performed such that the conductive layer includes at least 95 weight percent aluminum, no more than 0.5 weight percent nickel, and no more than 0.5 weight percent chromium.

5. The process of claim 4, wherein the step of forming the conductive layer is performed such that the conductive layer includes at least 99 weight percent aluminum, between about 0.1-0.5 weight percent nickel, and between about 0.02-0.1 weight percent chromium.

6. The process of claim 5, wherein the step of forming the conductive layer is performed such that the alloy consists of aluminum, nickel, and chromium.

7. The process of claim 1, wherein the step of forming the interconnecting member further comprises steps of:
   forming a barrier layer prior to the step of forming the conductive layer; and
   forming an antireflective coating after the step of forming the conductive layer.

8. The process of claim 7, wherein the step of forming the interconnecting member further comprises a step of forming a glue layer before the step of forming the barrier layer.

9. A process for forming a semiconductor device comprising the steps of:
   forming a conductor, wherein the conductor is selected from a group consisting of a doped region lying within a semiconductor substrate, a gate electrode overlying the substrate, a silicon-containing electrode overlying the substrate, and a metal-containing member overlying the substrate;
   forming an insulating layer over the conductor and including an opening, wherein at least a portion of the conductor is exposed within the opening;
   forming an interconnecting member over the insulating layer and electrically connected to the conductor, wherein the interconnecting member is formed by steps including:

forming a conductive layer, wherein:

the conductive layer includes an alloy;

the alloy includes at least 99 weight percent aluminum, about 0.1–0.5 weight percent nickel, and about 0.02–0.1 weight percent chromium, but no silicon; and a portion of the conductive layer is formed over the insulating layer and another portion of the conductive layer is formed at a location that is selected from a group consisting of overlying the opening of the insulating layer and lying within the opening of the insulating layer;

etching the conductive layer, wherein the conductive layer extends along all of the interconnecting member; and forming a passivation layer over the interconnecting member.

10. The process of claim 9, wherein the step of forming the conductive layer is performed such that the alloy consists of aluminum, nickel, and chromium.

11. The process of claim 9, wherein the step of forming the interconnecting member further comprises steps of:

forming a barrier layer prior to the step of forming the conductive layer; and forming an antireflective coating after the step of forming the conductive layer.

12. The process of claim 11, wherein the step of forming the interconnecting member further comprises a step of forming a glue layer before the step of forming the barrier layer.

13. The process of claim 12, wherein:

the glue layer includes titanium;

the barrier layer includes titanium nitride; and the antireflective coating includes titanium nitride.

14. The process of claim 9, further comprising a step of annealing the interconnecting member after the step of forming the passivation layer.

15. The process of claim 9, wherein the conductive layer does not include copper.

16. A process for forming a semiconductor device comprising the steps of:

forming a conductor, wherein the conductor is selected from a group consisting of a doped region lying within a semiconductor substrate, a gate electrode overlying the substrate, a silicon-containing electrode overlying the substrate, and a metal-containing member overlying the substrate;

forming an insulating layer over the conductor and including an opening, wherein at least a portion of the conductor is exposed within the opening;

forming a plug within the opening, wherein the plug is selected from a group consisting of a contact plug and a via plug; and forming an interconnecting member that includes a conductive layer that extends along all of the interconnecting member, wherein:

a portion of the interconnecting member is formed over the insulating layer and another portion of the interconnecting member is formed overlying the plug;

the interconnecting member includes a conductive layer that is an alloy that consists of aluminum, nickel, and chromium and has at least 99 weight percent aluminum, 0.1–0.5 weight percent nickel, and 0.02–0.1 weight percent chromium; and the interconnecting member is formed such that it is electrically connected to the conductor; and forming a passivation layer over the interconnecting member.

17. The process of claim 16, wherein the step of forming the interconnecting member further comprises steps of:

forming a glue layer prior to the step of forming the conductive layer;

forming a barrier layer overlying the glue layer, wherein the step of forming the barrier layer is performed prior to the step of forming the conductive layer; and forming an antireflective coating after the step of forming the conductive layer.

18. The process of claim 16, wherein the glue layer includes titanium;

the barrier layer includes titanium nitride;

the antireflective coating includes titanium nitride; and the plug includes tungsten.

19. The process of claim 16, wherein the plug is a via plug.

20. The process of claim 16, further comprising a step of annealing the interconnecting member after the step of forming the passivation layer.

* * * * *